(12) United States Patent
Hong et al.

(10) Patent No.: US 9,163,709 B2
(45) Date of Patent: *Oct. 20, 2015

(54) GANTRY APPARATUS

(71) Applicant: Samsung Electronics Co., Ltd., Suwon-Si, Gyeonggi-Do (KR)

(72) Inventors: Sang Joon Hong, Suwon-si (KR); Oui Serg Kim, Seongnam-si (KR); Sang Hyun Park, Yongin-si (KR); Roger Francisus Mattheus M Hamelinck, Delft (NL)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/087,371

(22) Filed: Nov. 22, 2013

(65) Prior Publication Data

US 2014/0076105 A1   Mar. 20, 2014

Related U.S. Application Data

(63) Continuation of application No. 13/280,753, filed on Oct. 25, 2011, now Pat. No. 8,610,891.

(30) Foreign Application Priority Data

Oct. 26, 2010   (KR) .................. 10-2010-0104962

(51) Int. Cl.
  *G01N 21/00* (2006.01)
  *F16H 21/44* (2006.01)
  *G03F 7/20* (2006.01)

(52) U.S. Cl.
  CPC ............ *F16H 21/44* (2013.01); *G03F 7/70391* (2013.01); *Y10T 74/18888* (2015.01)

(58) Field of Classification Search
  USPC ............ 356/237.1–237.6, 239.3, 239.7, 616; 345/173–175, 166, 156, 63, 690; 250/492.2, 492.22
  See application file for complete search history.

(56) References Cited

U.S. PATENT DOCUMENTS

| 8,610,891 B2 * | 12/2013 | Hong et al. ............... 356/237.5 |
| 2006/0023206 A1 * | 2/2006 | Iwanaga et al. ............ 356/244 |
| 2009/0189089 A1 * | 7/2009 | Bedingham et al. ....... 250/459.1 |
| 2010/0253712 A1 | 10/2010 | Tomioka et al. |

* cited by examiner

*Primary Examiner* — Tri T Ton
(74) *Attorney, Agent, or Firm* — Harness, Dickey & Pierce

(57) ABSTRACT

A gantry apparatus includes a structure to couple and support an optical system has enhanced rigidity, which minimizes deformation of the structure even if a plurality of optical systems is coupled to the structure. The gantry apparatus includes an optical system, a drive device to drive the optical system, and a structure to couple and support the drive device. The structure includes a plurality of first plates arranged parallel to one another, and a plurality of second plates intersecting the plurality of first plates to define receptive corridors, each of which receives the drive device.

7 Claims, 15 Drawing Sheets

GANTRY APPARATUS

CROSS-REFERENCE TO RELATED APPLICATIONS

This application is a continuation under 35 U.S.C. §120 of U.S. application Ser. No. 13/280,753, filed Oct. 25, 2011, which claims priority under 37 U.S.C. §119 to Korean Patent Application No. 2010-0104962, filed on Oct. 26, 2010 in the Korean Intellectual Property Office (KIPO), the entire contents of each of which is incorporated herein by reference.

BACKGROUND

1. Field

Example embodiments relate to a gantry apparatus usable with an exposure apparatus to form a pattern on a surface of a display, such as a Plasma Display Panel (PDP) or a Liquid Crystal Display (LCD), or an inspection apparatus to inspect defects of the pattern formed on the surface of the display.

2. Description of the Related Art

In general, displays, such as LCDs and PDPs, are designed to display an image using a pattern formed on a glass surface thereof to constitute pixels.

Although the earliest displays were used in small information terminals, as the use of displays has recently extended to TVs, monitors and the like, there is a need for increased size and precision of a display substrate.

In an exposure apparatus to form a pattern on a surface of a display substrate or an inspection apparatus to inspect the pattern formed on the substrate surface, an optical system to expose or inspect the substrate is coupled to a structure including a drive device to drive the optical system. Increasing the size of the substrate may require coupling of a greater number of optical systems to the structure.

The greater the number of optical systems coupled to the structure, the more severe is sagging due to the weight of the optical systems as well as the weight of the structure. This may deteriorate exposure or inspection precision of the substrate, causing production of defective display substrates.

SUMMARY

At least one example embodiment provides a gantry apparatus having a configuration to enhance mechanical rigidity.

At least one example embodiment provides a gantry apparatus having a configuration to realize an effective layout of a plurality of optical systems.

At least one example embodiment provides a gantry apparatus having a configuration to enable minute adjustment of an optical system.

Additional aspects will be set forth in part in the description which follows and, in part, will be obvious from the description, or may be learned by practice of the invention.

In accordance with an example embodiment, a gantry apparatus may include an optical system, a drive device to drive the optical system, and a structure to support the drive device. In this example embodiment, the structure may include a plurality of first plates arranged parallel to one another and a plurality of second plates intersecting the plurality of first plates. In this example embodiment, the plurality of first plates and the plurality of second plates may define at least one receptive corridor receiving the drive device.

In accordance with an example embodiment, a gantry apparatus may include an optical system for one of inspection and exposure of a substrate, a drive device to support the optical system, and a structure to couple the drive device. In this example embodiment, the structure may include a plurality of first plates and a plurality of second plates arranged between the plurality of first plates, and the plurality of first plates and the plurality of second plates may define a first receptive corridor, in which the optical system is arranged, and a second receptive corridor, in which the drive device is arranged.

In accordance with one example embodiment, a gantry apparatus includes an optical system, a drive device to drive the optical system, and a structure to couple and support the drive device, wherein the structure includes a plurality of first plates arranged parallel to one another, and a plurality of second plates intersecting the plurality of first plates to define receptive corridors, each of which receives the drive device.

The drive device may include a moving unit coupled to the optical system, and a drive unit to drive the moving unit, and the drive unit may include a panel inserted in the corresponding receptive corridor.

The receptive corridor may include a first receptive corridor, in which the optical system is arranged, and a second receptive corridor, in which the panel is inserted.

The panel may include a lower panel inserted in the second receptive corridor so as to enhance rigidity of the structure, and an upper panel extending from adjacent sides of the lower panel.

A lever may be pivotally coupled to the upper pane and may include a press portion to press one side of the upper panel.

A drive motor may be coupled to the lower panel and may be connected to one side of the lever so as to provide the lever with drive force.

A strut may be coupled into the upper panel so as to support the moving unit and the optical system.

The moving unit may include a coupling ring to receive and couple the optical system at an inner peripheral surface thereof, and at least two moving panels coupled to the coupling ring and arranged to surround the optical system.

The at least two moving panels may be connected to each other and may be coupled to the upper panel so as to be moved in linkage with the upper panel when the lever presses the upper panel.

A rigidity enhancing member may be coupled to the exterior of the structure so as to enhance rigidity of the structure, and the plurality of first plates or the plurality of second plates may extend inward of the rigidity enhancing member.

The second plates may be shorter than the first plates and be arranged between the plurality of first plates such that both ends of each second plate are respectively coupled to the plurality of first plates.

The plurality of first plates and the plurality of second plates may be coupled to each other via bolts, and a coupling block to enhance coupling force between the plurality of first plates and the plurality of second plates may be inserted in the second receptive corridor.

In accordance with an example embodiment, a gantry apparatus includes an optical system for inspection or exposure of a substrate, a drive device to drive the optical system, and a structure to couple the drive device, wherein the structure includes a plurality of first plates, and a plurality of second plates arranged between the plurality of first plates, and wherein the plurality of first plates and the plurality of second plates define a first receptive corridor, in which the optical system is arranged, and a second receptive corridor, in which the drive device is arranged.

An area of the first receptive corridor may be greater than an area of the second receptive corridor.

The second plates may be shorter than the first plates and be coupled between the plurality of first plates.

The plurality of first plates and the plurality of second plates may be coupled to each other via bolts, and a coupling block to enhance coupling force between the plurality of first plates and the plurality of second plates may be inserted in the second receptive corridor.

A rigidity enhancing member may be coupled to the exterior of the structure so as to enhance rigidity of the structure, and the plurality of first plates or the plurality of second plates may extend inward of the rigidity enhancing member.

The drive device may include a plurality of panels, each of which is inserted into the second receptive corridor, and a moving unit mounted on the plurality of panels, and the moving unit may include a coupling ring to receive and couple the optical system at an inner peripheral surface thereof, and at least two moving panels coupled to the coupling ring and arranged to surround the optical system.

The panels may include a lower panel inserted in the second receptive corridor to enhance rigidity of the structure, and an upper panel coupled to a corresponding one of the moving panels.

The upper panel may extend from adjacent sides of the lower panel and define a stepped portion along with the lower panel, and the lever may be arranged on the stepped portion and be pivotally coupled to the upper panel.

A drive motor may be coupled to the lower panel and be connected to one side of the lever so as to provide the lever with drive force.

The lever may include a press portion to press one side of the upper panel.

The at least two moving panels may be connected to each other and be moved in linkage with the upper panel when the lever presses the upper panel.

BRIEF DESCRIPTION OF THE DRAWINGS

These and/or other aspects of the invention will become apparent and more readily appreciated from the following description of the example embodiments, taken in conjunction with the accompanying drawings of which.

DETAILED DESCRIPTION

Figure 1:
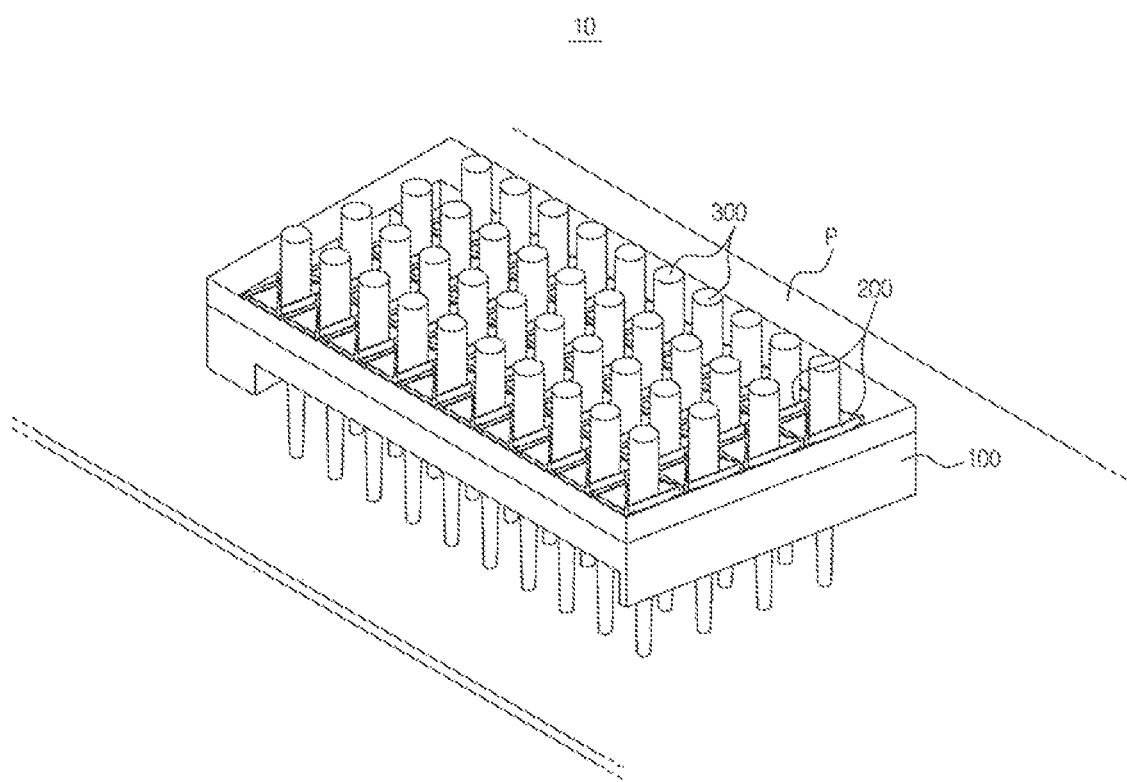
FIG. 1 is a perspective view illustrating a gantry apparatus in accordance with an example embodiment.

Example embodiments will be described more fully hereinafter with reference to the accompanying drawings, in which example embodiments are shown. The present invention may, however, be embodied in many different forms and should not be construed as limited to example embodiments as set forth herein. Rather, example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers that may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made in detail to the example embodiments of the present invention which are illustrated in the accompanying drawings, wherein like reference numerals refer to like elements throughout.

Figure 2:
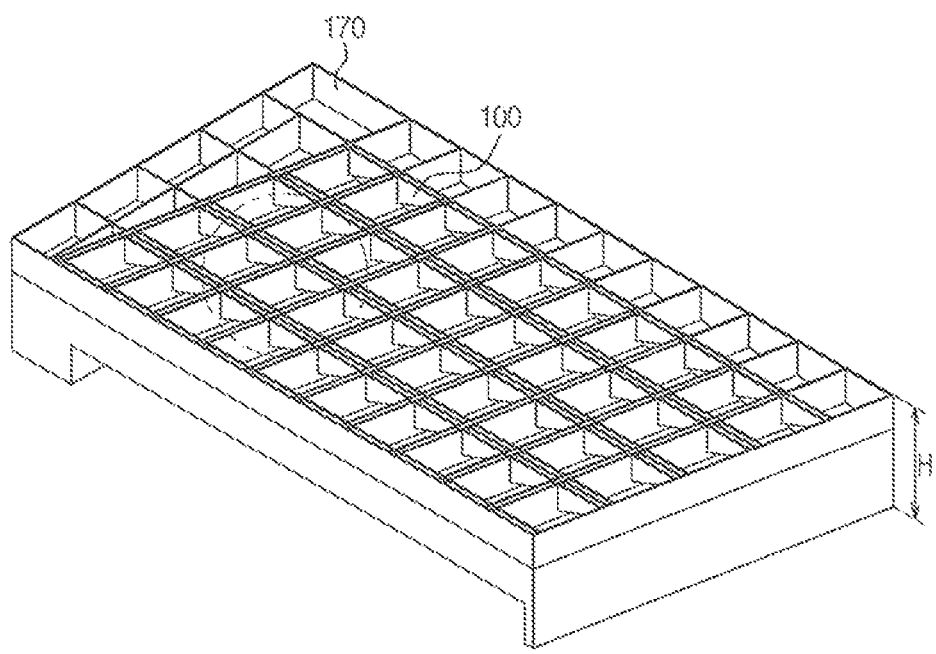
FIG. 2 is a perspective view illustrating a structure of FIG. 1.
Figure 3:
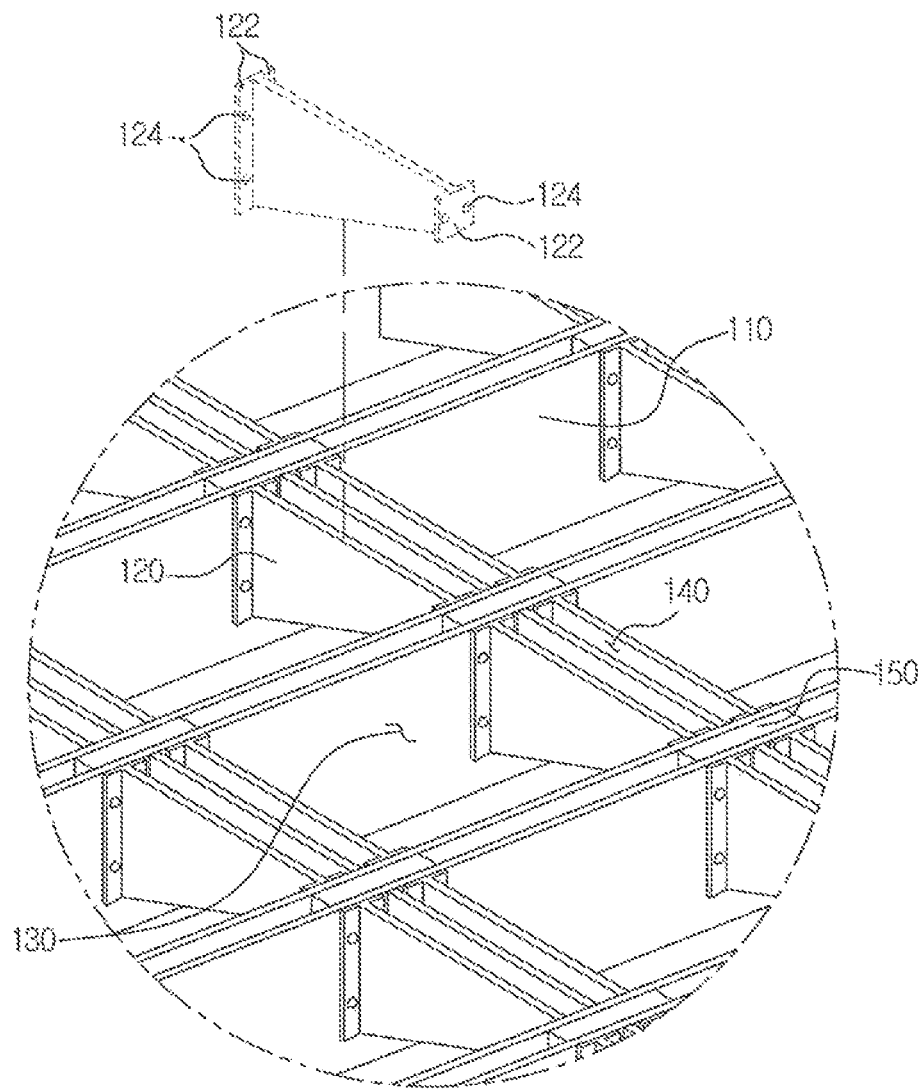
FIG. 3 is an enlarged perspective view of a part of FIG. 2, illustrating a coupling relationship between a first plate and a second plate constituting the structure.
Figure 4:
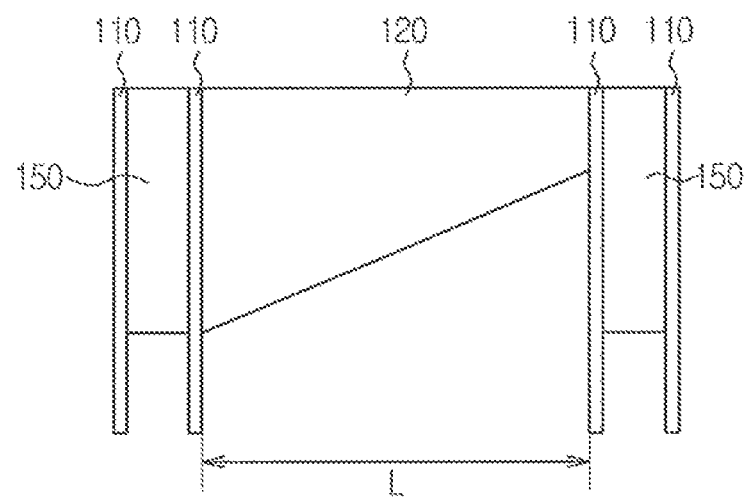
FIG. 4 is a front view illustrating the coupling relationship between the first plate and the second plate.
Figure 5:
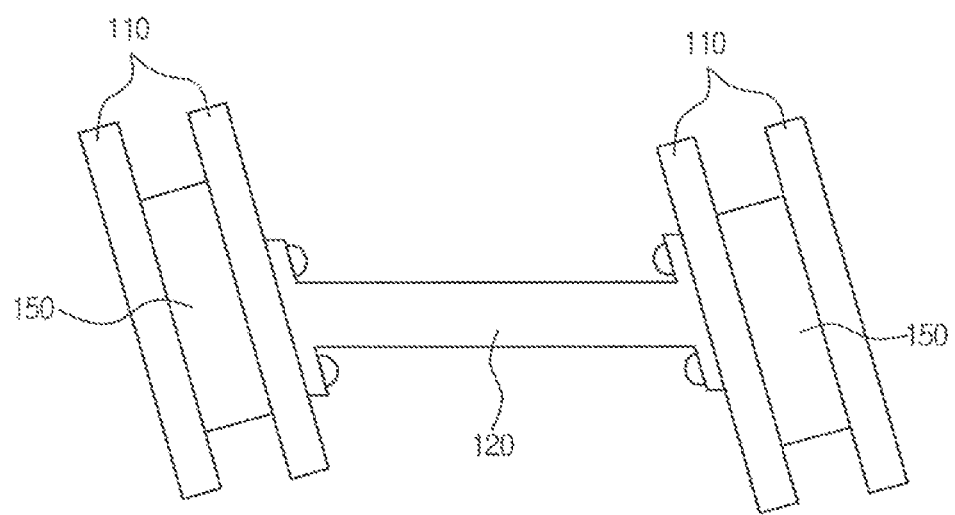
FIG. 5 is a plan view illustrating the coupling relationship between the first plate and the second plate.

FIG. 1 is a perspective view illustrating a gantry apparatus in accordance with an example embodiment, FIG. 2 is a perspective view illustrating a structure of FIG. 1, FIG. 3 is an enlarged perspective view of a part of FIG. 2, illustrating a coupling relationship between a first plate and a second plate constituting the structure, FIG. 4 is a front view illustrating the coupling relationship between the first plate and the second plate, and FIG. 5 is a plan view illustrating the coupling relationship between the first plate and the second plate. In FIG. 2, illustration of a cover of a rigidity enhancing member coupled to the exterior of the structure is omitted.

As illustrated in FIGS. 1 to 5, the gantry apparatus 10 includes optical systems 300 used to expose or inspect a surface of a substrate P, drive devices 200 to drive the optical systems 300, and a structure 100 to support the drive devices 200.

The structure 100 includes first plates 110 and second plates 120 arranged to intersect the first plates 110.

The first plates 110 are arranged parallel to each other in a given direction of the structure 100. The second plates 120 have a desired (or alternatively, a predetermined) angle with respect to the first plates 110 so as to intersect the first plates 110.

The second plates 120 are shorter than the first plates 110 and may be coupled between and/or to the neighboring first plates 110.

As illustrated in FIGS. 3 to 5, the second plate 120 has a trapezoidal shape, both ends of which have different lengths. The second plate 120 is provided at both ends thereof with portions 122 to enable coupling with the first plates 110. In example embodiments, the portions 122 may or may not be angled. The portion 122 may have holes 124, through which bolts are fastened to couple the second plate 120 to the first plate 110. Although the above description uses bolts to fasten a second plate 120 to a first plate 110, the invention is not limited thereto. For example, the plates 110 and 120 may be, alternatively, welded, glued, or riveted together.

The reason of providing both ends of the second plate 120 with different lengths is to release stress due to a processing tolerance when the second plate 120 is coupled between the neighboring first plates 110.

Generally, it is difficult to process the second plate 120 to have completely the same length as a distance L between the neighboring first plates 110 due to a processing tolerance of the second plate 120. Therefore, when attempting to couple the second plate 120, both ends of which have the same length, to the first plates 110, the second plate 120 is subjected to compressive stress (if the length of the second plate 120 is longer than the distance L) or tensile stress (if the length of the second plate 120 is shorter than the distance L). However, if the second plate 120 has both ends of different lengths and thus, has different contact areas with the respective first plates 110, it is possible to reduce internal stress (compressive stress or tensile stress) applied to the second plate 120.

The first plates 110 and the second plates 120 define first receptive corridors 130 and second receptive corridors 140.

The first receptive corridors 130 are wider than the second receptive corridors 120 and are configured to receive the optical systems 300 therein. Specific elements of the drive devices 200 are inserted and coupled into the second receptive corridors 140.

Coupling blocks 150 to enhance coupling force between the first plates 110 and the second plates 120 are inserted into the second receptive corridors 140.

The first plates 110 and the second plates 120 are made of thin plates having a thickness of 5 mm or less. Thus, when the second plate 120 is bolted to the first plate 110, a bolt insertion length may be insufficient to provide satisfactory coupling force. The coupling block 150 is arranged at a bolt coupling position to provide a sufficient bolt insertion length, thereby providing force sufficient to firmly couple the first plate 110 and the second plate 120 to each other.

All the first plates 110 and the second plates 120 intersect each other to construct the structure 100 having a web shape.

The structure 100 to couple and support the optical systems 300 and the drive devices 200 requires a design insensitive to the weights of the optical systems 300 and the drive devices 200 as well as the weight of the structure 100.

The weights of the optical systems 300 and the drive devices 200 as well as the weight of the structure 100 may cause vertical sagging of the structure 100. The most important factor to achieve rigidity sufficient to minimize the vertical sagging is a height H of the structure 100.

The sagging of the structure 100 may be estimated similar to the sagging of a beam. In the case of a beam, the greater the secondary moment of an area, the lower the sagging degree of the beam. Since the secondary moment of an area most effectively increases as a height of the area increases (i.e. is proportional to the third power of the height of the area), vertical rigidity of the structure 100 effectively increases by increasing the height H of the structure 100 as compared to increasing the width of the structure 100.

The web-shaped structure 100 is configured in such a way that the first plates 100 and the second plates 120 are oriented in a height direction of the structure (i.e. in a direction perpendicular to the ground) (i.e. the first plates 100 and the second plates 120 are vertically erected). Providing the structure 100 with a greater vertical area than a horizontal area may reduce the weight of the entire structure 100, which minimizes effects due to the weight of the optical systems 300 and the drive devices 200 coupled to the structure 100 as well as the weight of the structure 100.

In addition, by orienting the first and second plates 110 and 120 made of thin plates having a thickness of 5 mm or less in the height direction of the structure 100, the structure 100 exhibits maximized space utilization in a horizontal direction, which allows the plurality of optical systems 300 to be densely arranged in the structure 100.

A rigidity enhancing member 170 may be further coupled to the exterior of the structure 100 to enhance horizontal rigidity of the structure 100.

The rigidity enhancing member 170 may have an approximately 'L'-shaped form and be coupled to two edges of the structure 100. The first plates 100 and the second plates 120 are coupled to the rigidity enhancing member 170 so as to extend inward thereof.

Although fabricating the web-shaped structure 100 as described above may achieve sufficient rigidity against a vertical force, there may still exist a need for sufficient rigidity against a horizontal force.

The structure 100 to couple and support the optical systems 300 and the drive devices 200 is coupled to a stage (not shown) so as to vertically or horizontally move over the substrate P. During horizontal movement of the structure 100, horizontal force due to acceleration or deceleration may be applied to the structure 100.

When coupling the rigidity enhancing member 170 to the exterior of the structure 100 such that the first plates 100 and the second plates 120 are coupled to the rigidity enhancing member 170 so as to extend inward thereof, the structure 100 may achieve enhanced horizontal rigidity.

Figure 6:
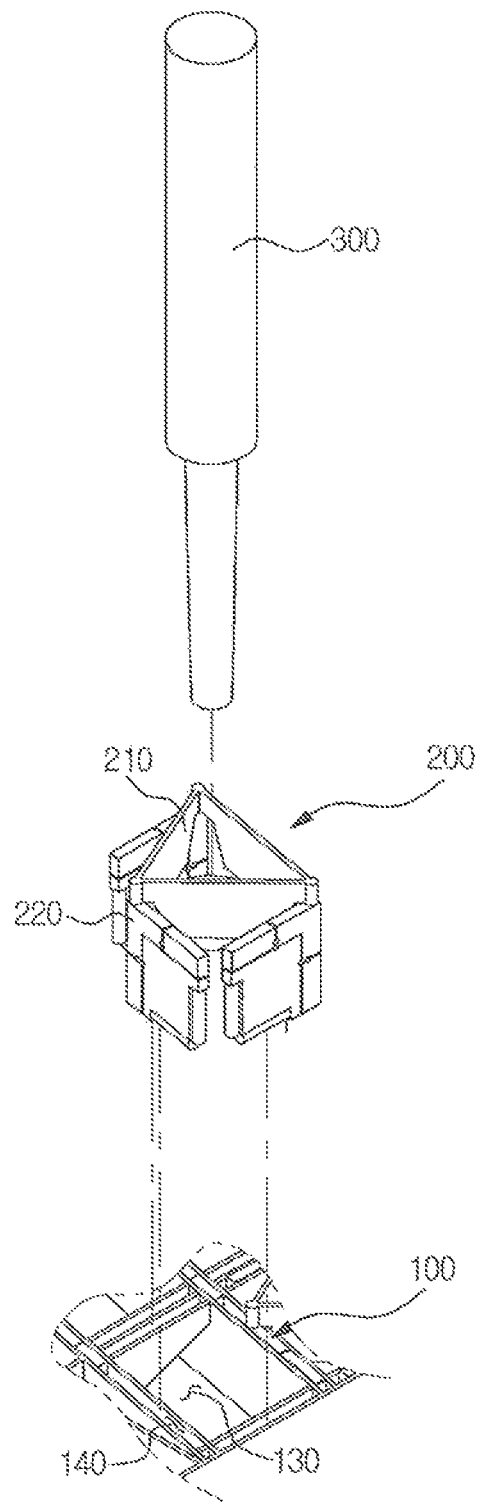
FIG. 6 is an exploded perspective view illustrating a part of the structure, a drive device and an optical system included in the gantry apparatus in accordance with the example embodiment.
Figure 7:
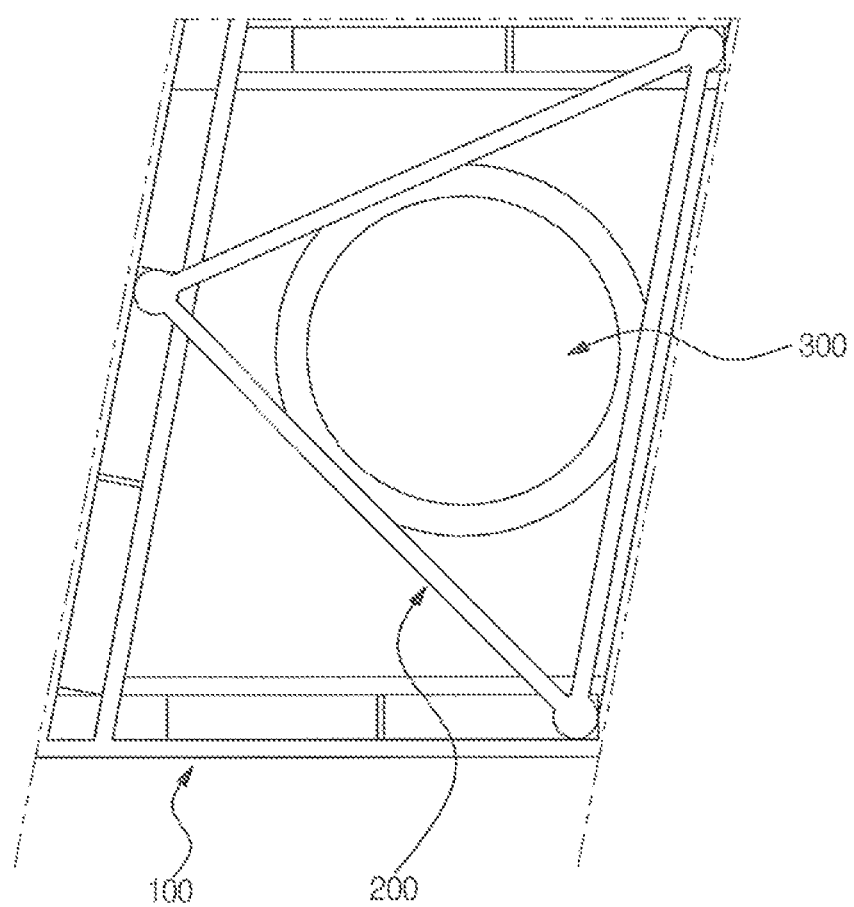
FIG. 7 is a plan view of FIG. 6.
Figure 8:
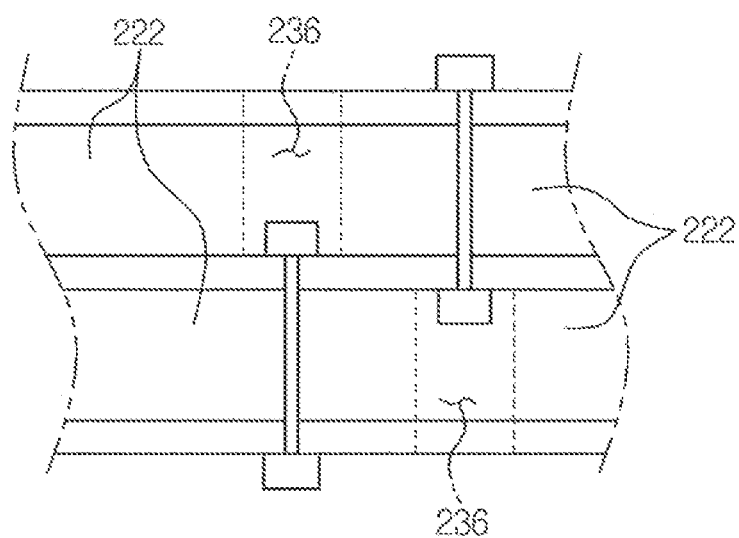
FIG. 8 is a partial view of FIG. 7 illustrating a coupling relationship between the structure and the drive device.
Figure 9:
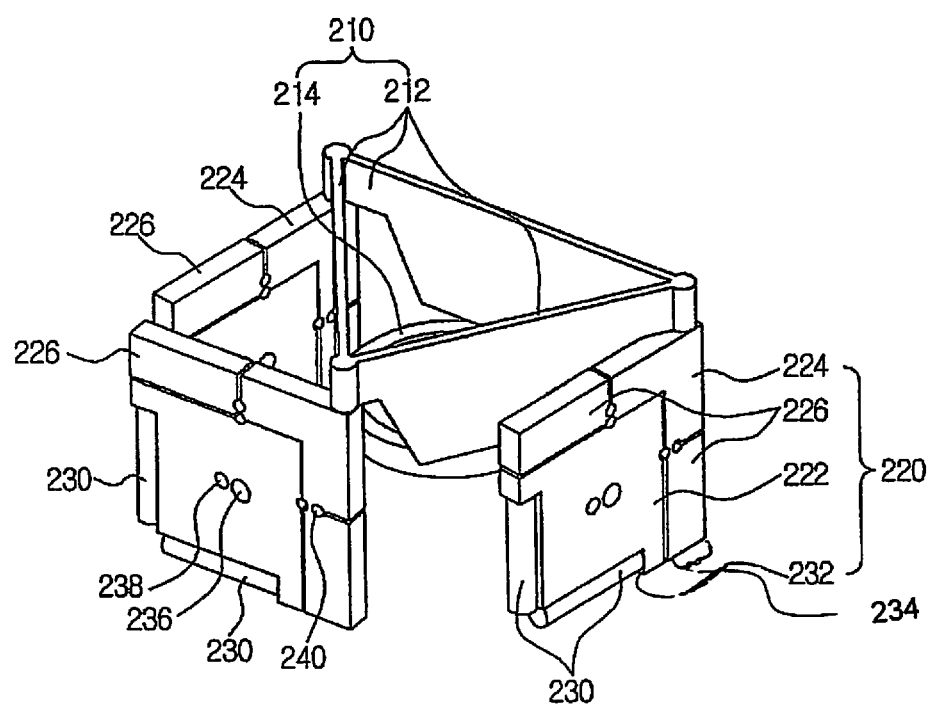
FIG. 9 is a perspective view illustrating the drive device of FIG. 6.

FIG. 6 is an exploded perspective view illustrating a part of the structure, the drive device and the optical system included in the gantry apparatus in accordance with the example embodiment, FIG. 7 is a plan view of FIG. 6, FIG. 8 is a partial view of FIG. 7 illustrating a coupling relationship between the structure and the drive device, and FIG. 9 is a perspective view illustrating the drive device of FIG. 6.

As illustrated in FIGS. 6 to 9, the drive device 200 includes a moving unit 210 coupled to the optical system 300 and a drive unit 220 to drive the moving unit 210.

The drive unit 220 includes lower panels 222, upper panels 224 provided at upper ends of the lower panels 222 and levers 226 to press the upper panels 224.

Referring to FIGS. 6 to 8, the lower panels 222 are inserted and coupled into the second receptive corridors 140 to enhance rigidity of the structure 100.

The lower panel 222 has a through-hole 236 and a screw-hole 238, to secure the lower panel 222 inserted in the second receptive corridor 140 to the first plate 110 or the second plate 120. The through-hole 236 serves to prevent or reduce interference between the lower panel 222 and an assembly tool when tightening or releasing a screw using the assembly tool, and the screw-hole 238 is provided with screw threads (not shown) by which the screw is tightened.

Drive motors 230 to drive the levers 226 are mounted to the lower panel 222. The lower panel 222 is provided at two adjacent edges thereof with mounting portions 232 to which the drive motors 230 are respectively mounted. Each drive motor 230 is coupled and fixed to a surface of the mounting portion 232 and serves to drive the corresponding lever 226.

The upper panel 224 extends from the other adjacent edges of the lower panel 222 irrespective of the mounting portion 232.

Figure 10A:
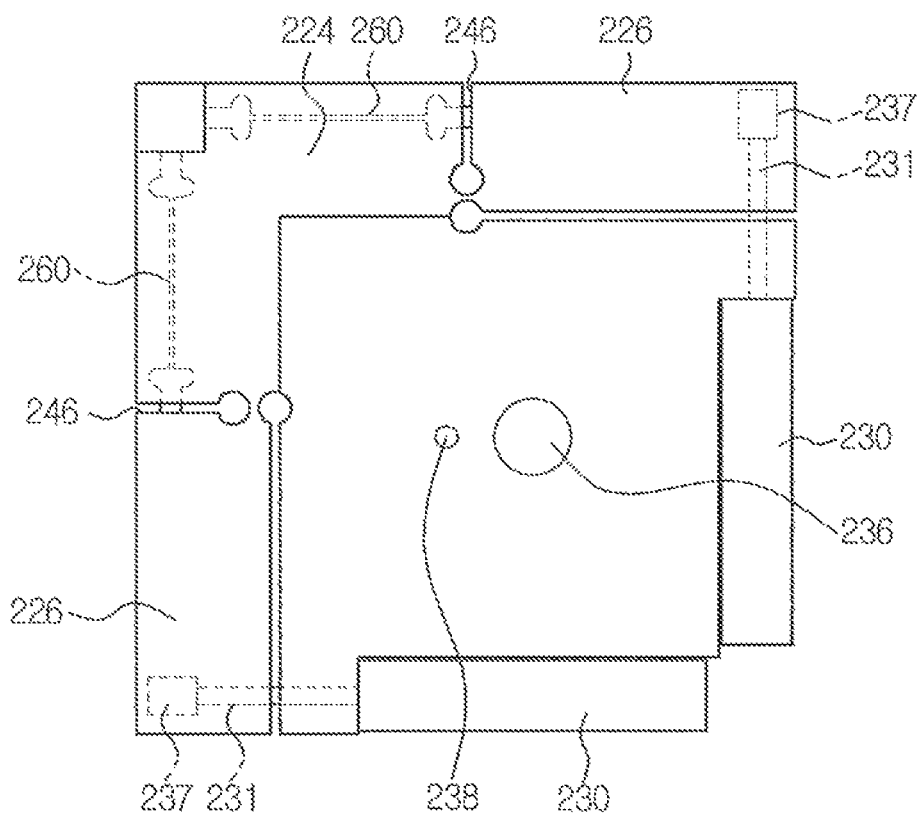
FIGS. 10A and 10B are views illustrating the principle of operating the drive device.
Figure 10B:
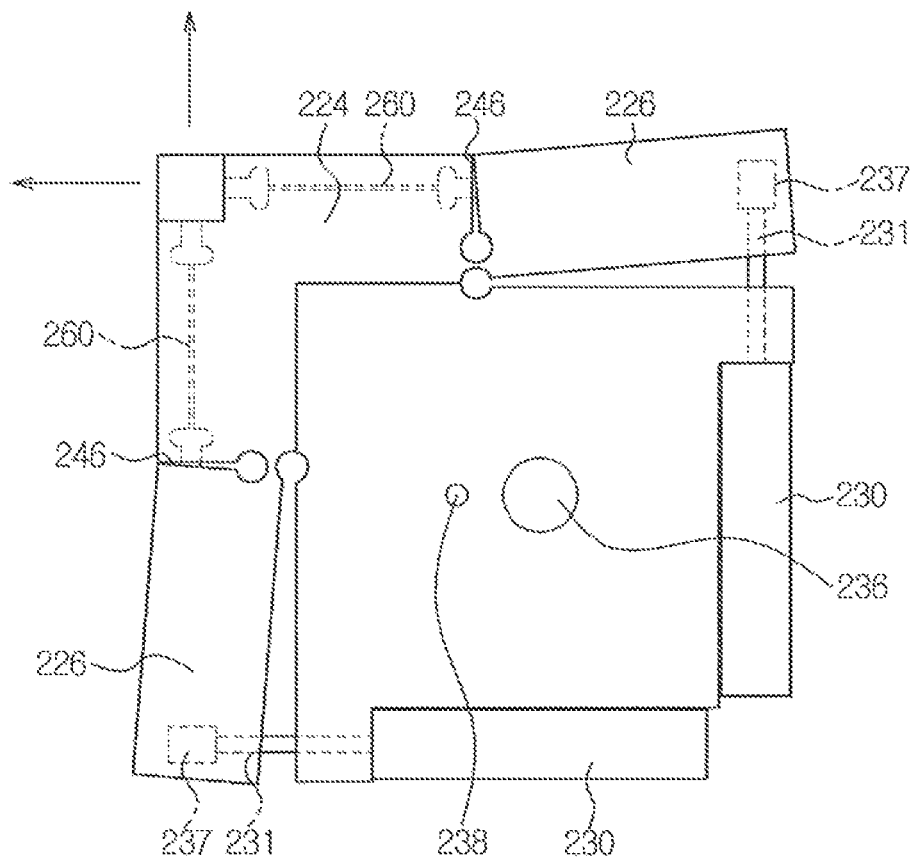

The upper panel 224 and the lower panel 222 together define stepped portions 234 and the levers 226 are respectively arranged in the stepped portions 234 (see FIGS. 10A and 10B).

The lever 226 is pivotally coupled to the upper panel 224 via a hinge 240 and includes a press portion (246, see FIGS. 10A and 10B) to press the upper panel 224. The press portion 246 presses one end of the upper panel 224 when the lever 226 pivots.

The drive motor 230 is connected to one end of the lever 226 through a shaft 231 and provides drive force to allow the lever 226 to pivot about the hinge 240.

A strut (260, see FIGS. 10A and 10B) is arranged in the upper panel 224 to support the weight of the optical system 300 and the weight of the moving unit 210. The strut 260 takes the form of an iron wire having a diameter of 3 mm or more to support the weight of the optical system 300 and the weight of the moving unit 210.

The lower panel 222 and the upper panel 224 are integrated with each other to construct a single panel 270 (see FIGS. 11A to 11D).

The moving unit 210 is mounted on the upper panels 224.

The moving unit 210 includes moving panels 212 and a coupling ring 214 coupled to lower ends of the moving panels 212.

The optical system 300 is received and fitted inside an inner peripheral surface of the coupling ring 214 and thus, the coupling ring 214 has a shape corresponding to an outer contour of the optical system 300.

The moving panels 212 are arranged to surround the optical system 300 fitted in the coupling ring 214. In the drive device 200 provided in the gantry apparatus 10 in accordance with the example embodiment, three moving panels 212 are coupled with one another at both ends thereof to construct a triangular arrangement such that the optical system 300 is arranged therein.

Hereinafter, the principle of operating the drive device 200 to minutely adjust the optical system 300 will be described.

FIGS. 10A and 10B are views illustrating the principle of operating the drive device, and FIGS. 11A to 11D are views illustrating the principle of realizing five degrees of freedom by the drive device.

As illustrated in FIGS. 10A and 10B, if the drive motor 230 mounted to the lower panel 222 is operated, the shaft 231 connected to the drive motor 230 is rotated. A ball nut 237 is connected to the shaft 231 so as to convert rotational motion of the shaft 231 into rectilinear motion. Thus, the lever 226 connected to the ball nut 237 is minutely pivoted about the hinge 240 away from the lower panel 222.

With pivoting of the lever 226, the press portion 246 of the lever 226 presses the end of the upper panel 224, causing the upper panel 224 to be minutely moved in a pivoting direction of the lever 226.

The moving panel 212 mounted on the upper panel 224 is moved in linkage with the upper panel 224 and enables minute adjustment of the optical system 300 coupled thereto.

The lower panel 222 and the upper panel 224 are provided with the two drive motors 230 and the two levers 226, to enable minute adjustment of the optical system 300 in two directions perpendicular to each other (two degrees of freedom).

As illustrated in FIGS. 11A to 11D, when three panels 270 are combined with the three moving panels 212, the drive device 200 to drive the optical system 300 with five degrees of freedom may be obtained. For convenience of description, a direction perpendicular to the ground is referred to as a Z-direction, a direction perpendicular to the Z-direction is an X-direction, and a direction perpendicular to both the Z-direction and the X-direction is referred to as a Y-direction.

Figure 11A:
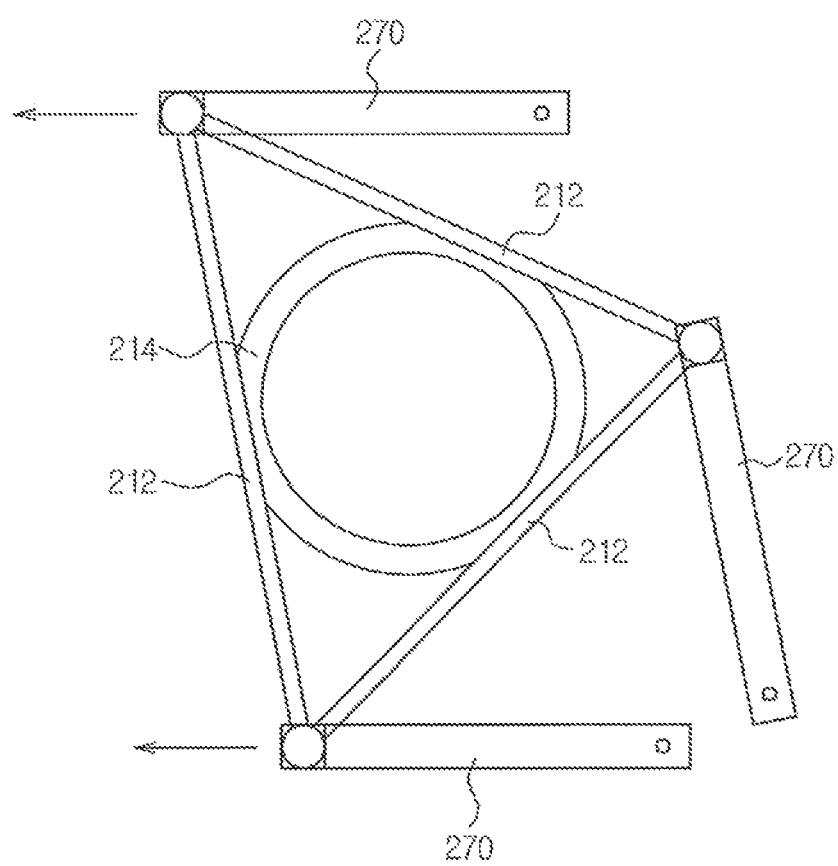
FIGS. 11A to 11D are views illustrating the principle of realizing five degrees of freedom by the drive device.
Figure 11B:
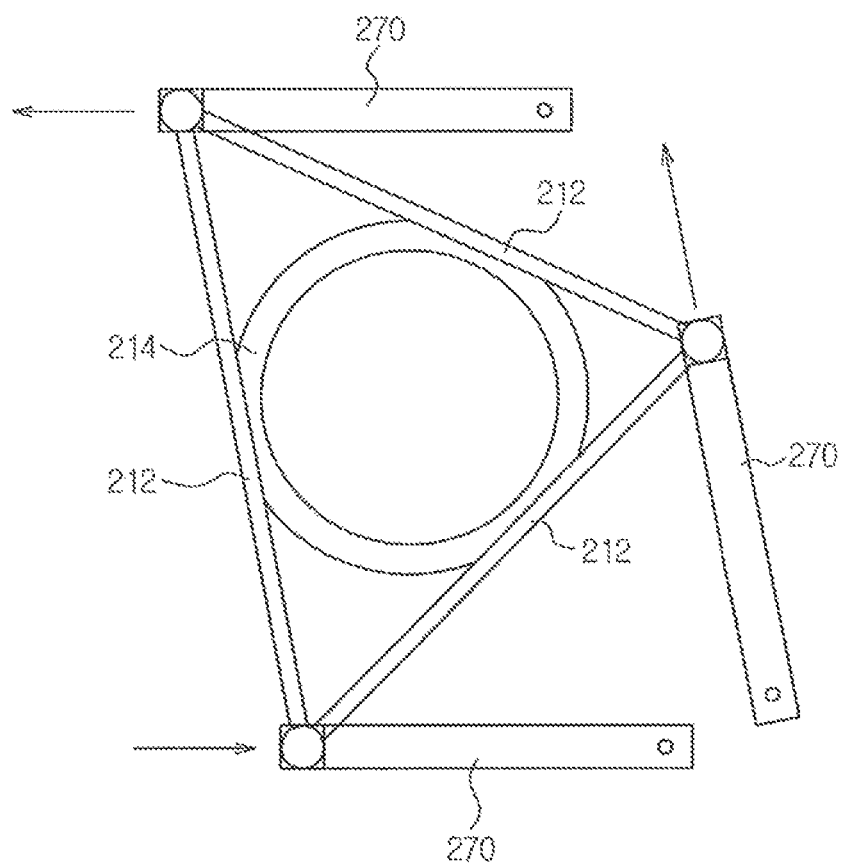

Referring to FIG. 11A, the levers 226 of two panels 270 facing each other may be driven in the X-direction to rectilinearly move the optical system 300 in the X-direction. Referring to FIG. 11B, the levers 226 of three panels 270 may be driven clockwise or counterclockwise to rotate the optical system 300 in the Z-direction.

Figure 11C:
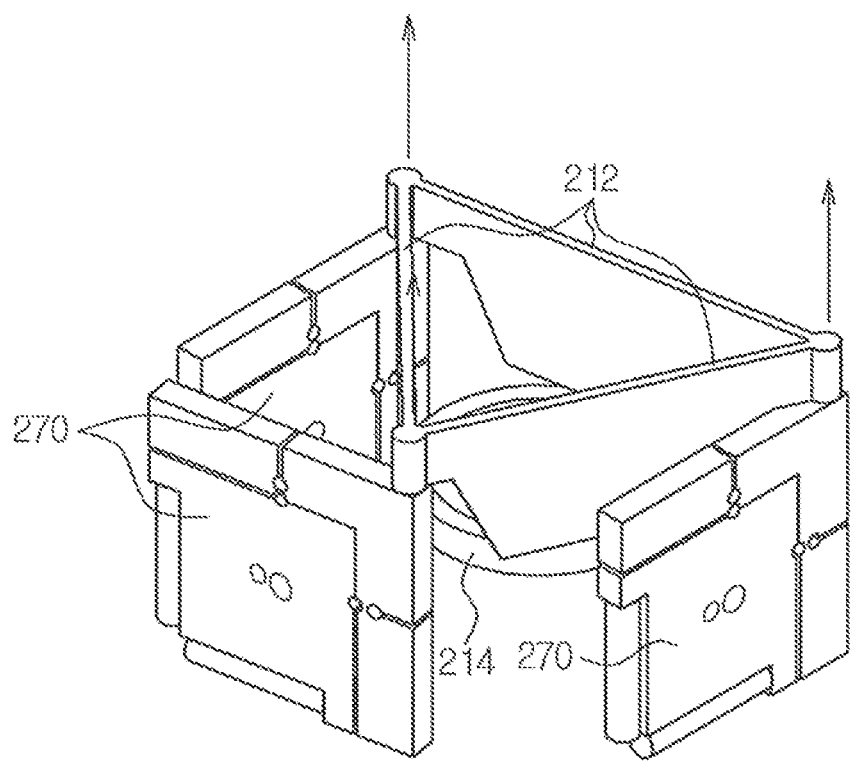
Figure 11D:
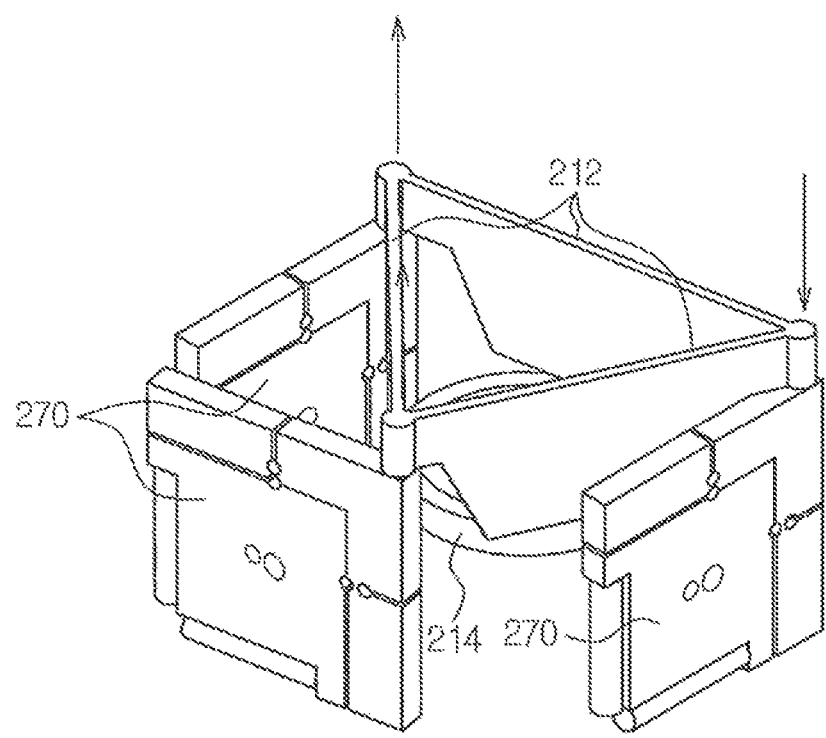

Referring to FIG. 11C, all the levers 226 of three panels 270 may be driven in the Z-direction to rectilinearly move the optical system 300 in the Z-direction. Also, referring to FIG. 11D, although all the levers 226 of three panels 270 are driven in the same direction (the Z-axis direction), the lever 226 of one panel 270 may be driven in an opposite direction to that of the other two panels 270 to rotate the optical system 300 in the X-direction or the Y-direction.

As is apparent from the above description, the example embodiments provide a gantry apparatus to enhance rigidity of a structure used to support an optical system coupled thereto, which minimizes deformation of the structure even if a plurality of optical systems is coupled to the structure.

Further, effective layout of the plurality of optical systems is possible, which may be advantageous for exposure or inspection of a large substrate and also, may reduce the size of the entire exposure or inspection apparatus.

Furthermore, it is possible to easily minutely adjust the optical system, resulting in enhanced exposure quality and high-precision inspection.

Although example embodiments have been shown and described, it would be appreciated by those skilled in the art that changes may be made in these example embodiments without departing from the principles and spirit of the invention, the scope of which is defined in the claims and their equivalents.

What is claimed is:

1. A driving apparatus for a gantry apparatus, the driving apparatus comprising:
    a moving unit coupled to an optical system; and
    a drive unit to drive the moving unit,
    wherein the drive unit includes a panel inserted into a receptive corridor of the gantry apparatus, the panel including a lower panel inserted in the receptive corridor and an upper panel formed on the lower panel; and
    the panel includes a lever formed on the lower panel and is pivotally coupled to the upper panel, and the lever includes a press portion to press the upper panel.

2. The driving apparatus for a gantry apparatus according to claim 1, wherein the panel further includes a drive motor coupled to the lower panel and connected to one side of the lever so as to provide the lever with drive force.

3. The driving apparatus for a gantry apparatus according to claim 2, wherein the upper panel includes a strut coupled into the upper panel so as to support the optical system and the moving unit.

4. The driving apparatus for a gantry apparatus according to claim 1, wherein the moving unit includes:
    a coupling ring to receive and couple the optical system at an inner peripheral surface thereof; and
    a plurality of moving panels coupled to the coupling ring and arranged to surround the optical system.

5. The driving apparatus for a gantry apparatus according to claim 4, wherein the plurality of moving panels are connected to each other and are coupled to the upper panel so as to be moved in linkage with the upper panel when the lever presses the upper panel.

6. The driving apparatus for a gantry apparatus according to claim 1, wherein the upper panel extends from adjacent sides of the lower panel and defines a stepped portion along with the lower panel, and
    wherein a lever is arranged on the stepped portion and is pivotally coupled to the upper panel.

7. The driving apparatus for a gantry apparatus according to claim 6, wherein the lever includes a press portion to press one side of the upper panel.

\* \* \* \* \*